(12) United States Patent
Sun et al.

(10) Patent No.: US 10,412,504 B2
(45) Date of Patent: Sep. 10, 2019

(54) MEMS MICROPHONE AND METHOD OF MANUFACTURING THE SAME

(71) Applicant: DONGBU HITEK CO., LTD., Seoul (KR)

(72) Inventors: Jong Won Sun, Gyeonggi-do (KR); Han Choon Lee, Seoul (KR)

(73) Assignee: DB HITEK CO., LTD., Seoul (KR)

( * ) Notice: Subject to any disclaimer, the term of this patent is extended or adjusted under 35 U.S.C. 154(b) by 0 days.

(21) Appl. No.: 15/497,374

(22) Filed: Apr. 26, 2017

(65) Prior Publication Data

US 2017/0311089 A1 Oct. 26, 2017

(30) Foreign Application Priority Data

Apr. 26, 2016 (KR) .................. 10-2016-0050886

(51) Int. Cl.
*B81B 3/00* (2006.01)
*B81B 7/00* (2006.01)
(Continued)

(52) U.S. Cl.
CPC ............ *H04R 19/04* (2013.01); *B81B 3/001* (2013.01); *B81B 7/0061* (2013.01);
(Continued)

(58) Field of Classification Search
CPC .............. H04R 19/04; H04R 19/005; H04R 2201/003; H04R 2307/204; B81B 3/0072
(Continued)

(56) References Cited

U.S. PATENT DOCUMENTS

| 5,189,777 A | 3/1993 | Guckel et al. |
| 7,932,117 B2 | 4/2011 | Ueya |
| (Continued) | | |

FOREIGN PATENT DOCUMENTS

| KR | 10-2010-0073051 | 7/2010 |
| KR | 10-1462375 | 11/2014 |
| (Continued) | | |

OTHER PUBLICATIONS

Application and File History for U.S. Appl. No. 15/497,358, filed Apr. 26, 2017. Inventors: Sun et al.
(Continued)

*Primary Examiner* — Sunita Joshi
(74) *Attorney, Agent, or Firm* — Patterson Thuente Pedersen, P.A.

(57) ABSTRACT

A MEMS microphone includes a substrate having a cavity, a back plate disposed over the substrate and having a plurality of acoustic holes, a diaphragm disposed over the substrate to cover the cavity, the diaphragm being disposed under the back plate to be spaced apart from the back plate, including venting holes communicating with the cavity, and sensing an acoustic pressure to create a displacement, a first insulation layer interposed between the substrate and the diaphragm to support the diaphragm, and the first insulation layer including an opening formed at a position corresponding to the cavity to expose the diaphragm, a second insulating layer formed over the substrate to cover an upper face of the back plate and an insulating interlayer formed between the first insulation layer and the second insulation layer, and the insulation interlayer being located outside the diaphragm and supporting the second insulation layer to make the back plate be spaced from the diaphragm. Thus, a process of manufacturing the MEMS microphone may be simplified.

19 Claims, 6 Drawing Sheets

(51) Int. Cl.
*B81C 1/00* (2006.01)
*H04R 7/06* (2006.01)
*H04R 19/00* (2006.01)
*H04R 19/04* (2006.01)
*H04R 31/00* (2006.01)

(52) U.S. Cl.
CPC ...... *B81C 1/00158* (2013.01); *B81C 1/00182* (2013.01); *H04R 7/06* (2013.01); *H04R 19/005* (2013.01); *H04R 31/003* (2013.01); *B81B 2201/0257* (2013.01); *B81B 2203/0127* (2013.01); *B81B 2203/0315* (2013.01); *B81C 2201/013* (2013.01); *B81C 2201/0109* (2013.01); *H04R 2201/003* (2013.01)

(58) Field of Classification Search
USPC ............... 381/175, 174, 181, 190, 191, 178; 367/170, 178, 163, 174
See application file for complete search history.

(56) References Cited

U.S. PATENT DOCUMENTS

| | | | |
|---|---|---|---|
| 8,942,394 B2* | 1/2015 | Conti | H04R 7/24 381/174 |
| 2004/0106221 A1 | 6/2004 | Hunter et al. | |
| 2006/0050905 A1 | 3/2006 | Ohbayashi et al. | |
| 2006/0145570 A1* | 7/2006 | Ohbayashi | H04R 19/005 310/322 |
| 2006/0233400 A1 | 10/2006 | Ohbayashi et al. | |
| 2006/0233401 A1* | 10/2006 | Wang | B81B 3/0072 381/176 |
| 2007/0249079 A1 | 10/2007 | Sasagawa et al. | |
| 2011/0127650 A1 | 6/2011 | Witvrouw et al. | |
| 2012/0139065 A1 | 6/2012 | van Beek et al. | |
| 2012/0229709 A1 | 9/2012 | Heald et al. | |
| 2012/0235969 A1 | 9/2012 | Burns et al. | |
| 2016/0362292 A1* | 12/2016 | Chang | H04R 19/005 |
| 2017/0311089 A1 | 10/2017 | Sun et al. | |

FOREIGN PATENT DOCUMENTS

| | | |
|---|---|---|
| KR | 10-1578542 | 12/2015 |
| KR | 101578542 B1 | 12/2015 |

OTHER PUBLICATIONS

Application and File History for U.S. Appl. No. 15/497,366, filed Apr. 26, 2017. Inventors: Sun et al.

Application and Filing Receipt for U.S. Appl. No. 15/414,104, filed Jan. 24, 2017. Inventors: Lee et al.

Application and Filing Receipt for U.S. Appl. No. 15/414,125, filed Jan. 24, 2017. Inventors: Lee et al.

Korean Office Action, Korean Application No. 10-2016-0050894, dated Feb. 22, 2018, 3 pages (7 pages with translation).

Korean Final Office Action, Korean Application No. 10-2016-0050894, dated Jun. 26, 2018, 4 pages (7 pages with translation).

* cited by examiner

[FIG. 1]
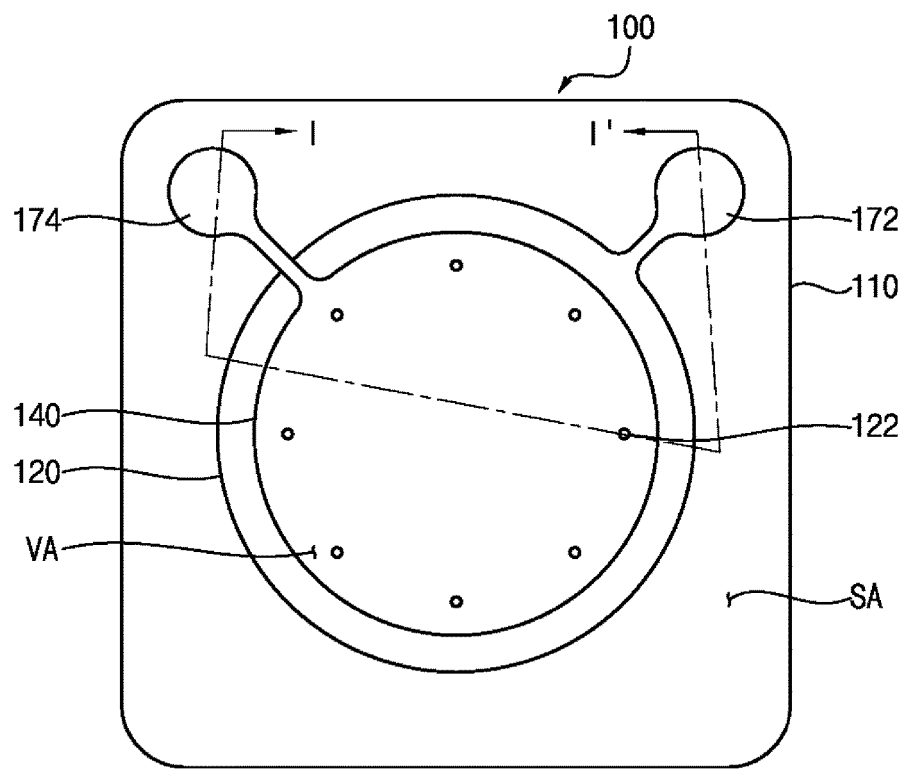
[FIG. 2]
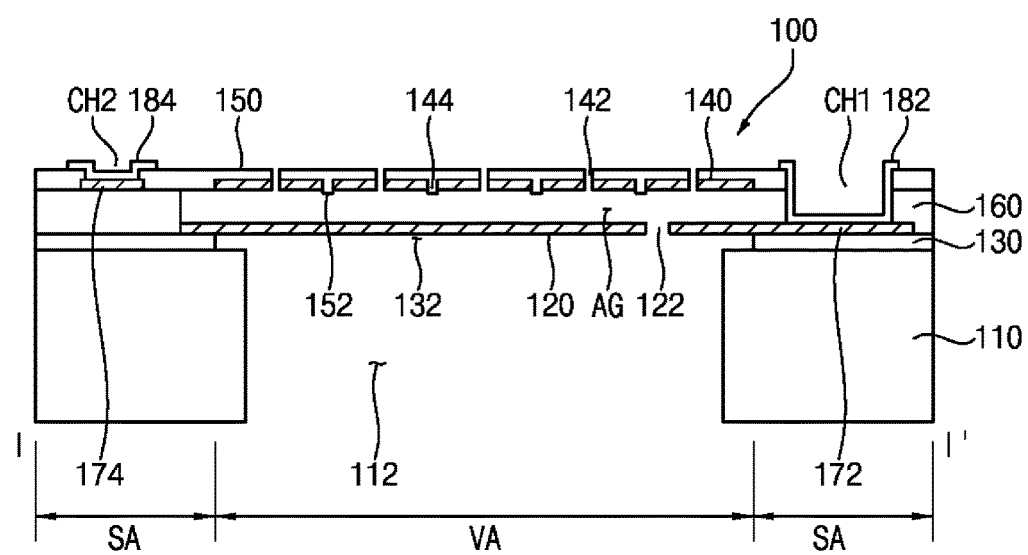

[FIG. 3]
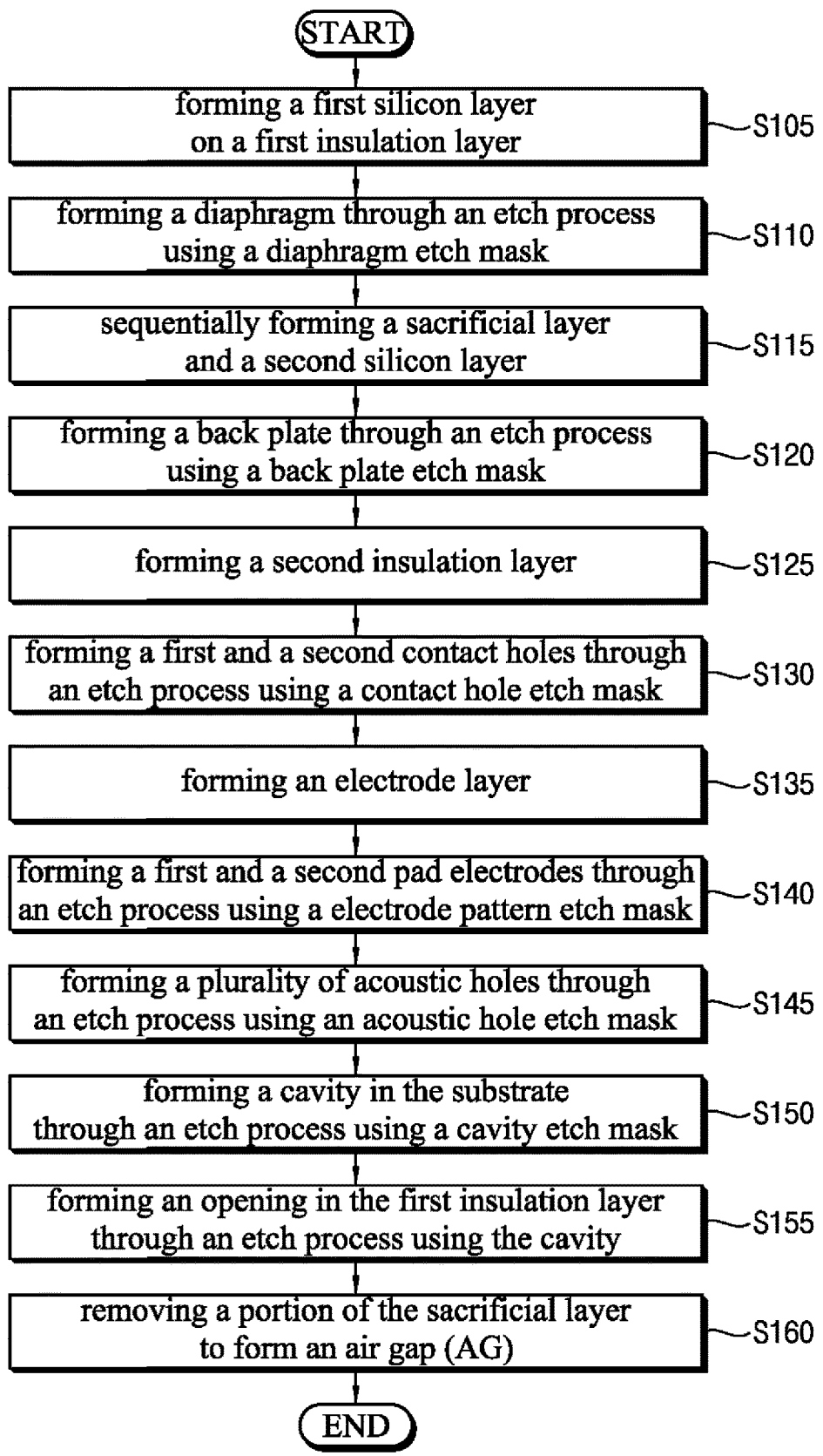

[FIG. 4]
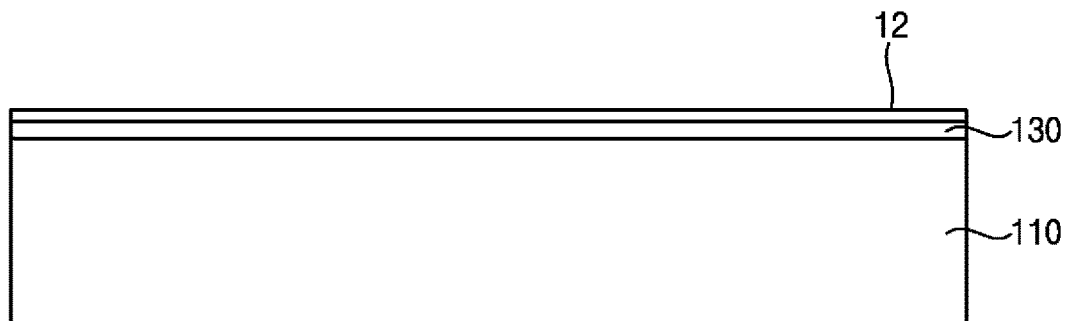
[FIG. 5]
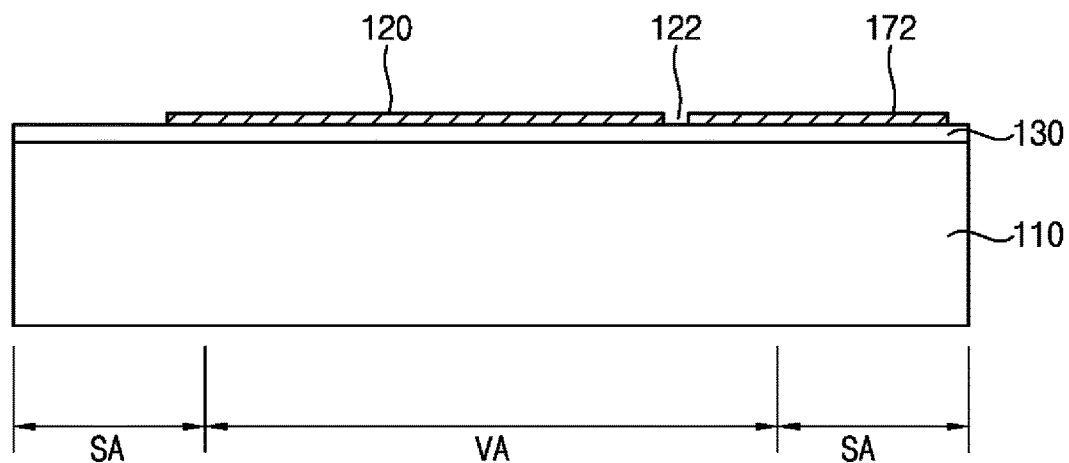
[FIG. 6]
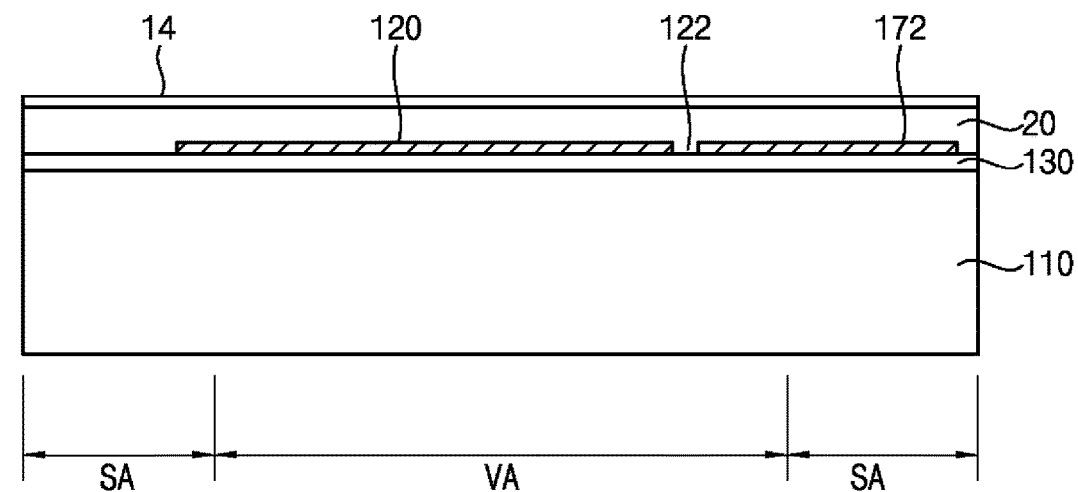

[FIG. 7]
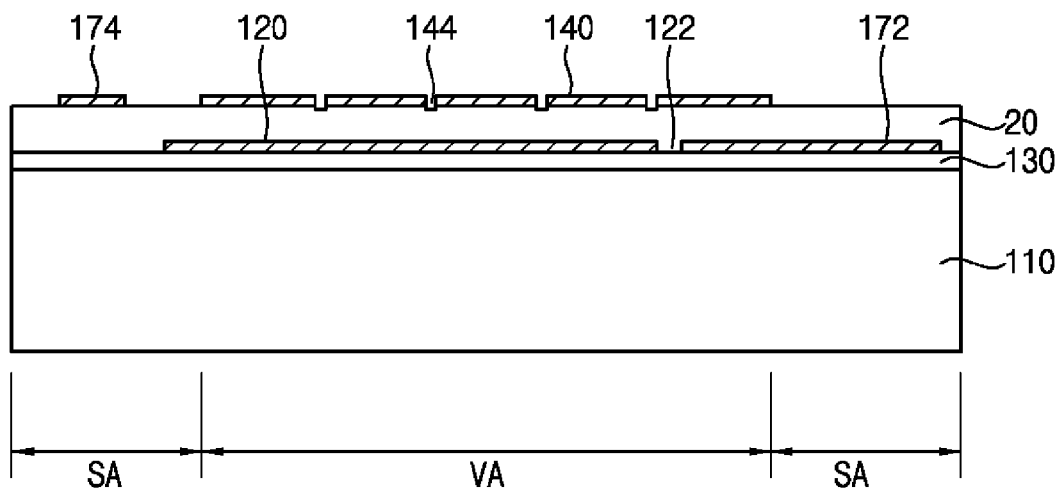
[FIG. 8]
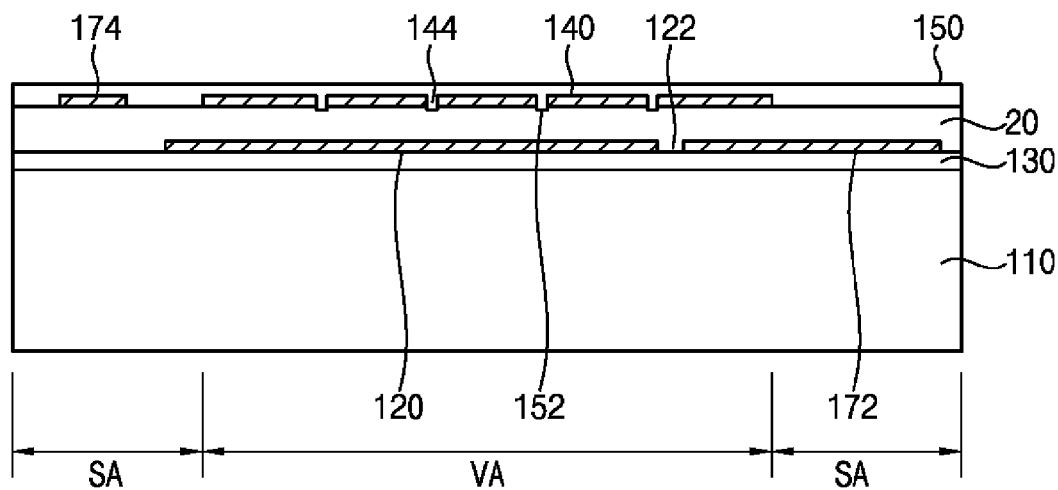

[FIG. 9]
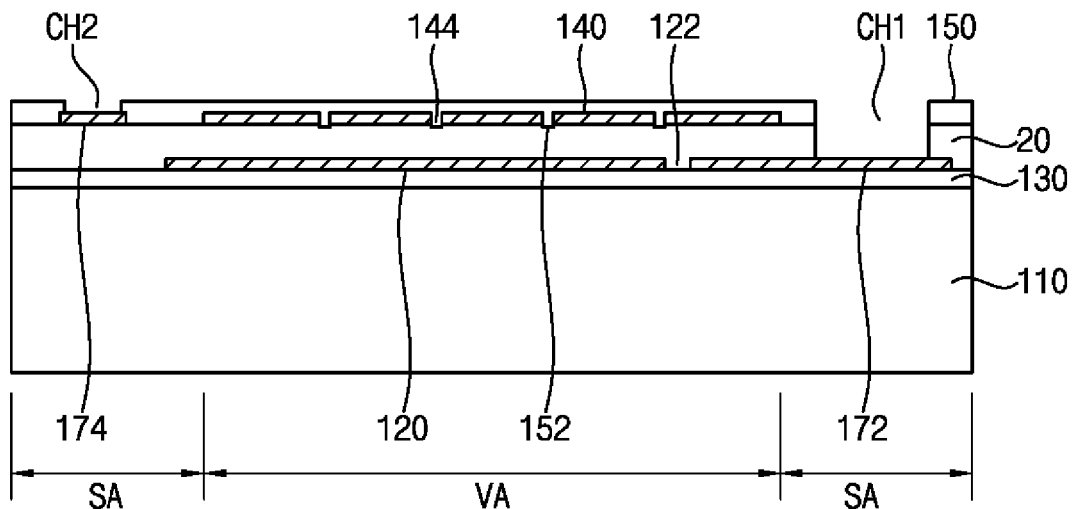
[FIG. 10]
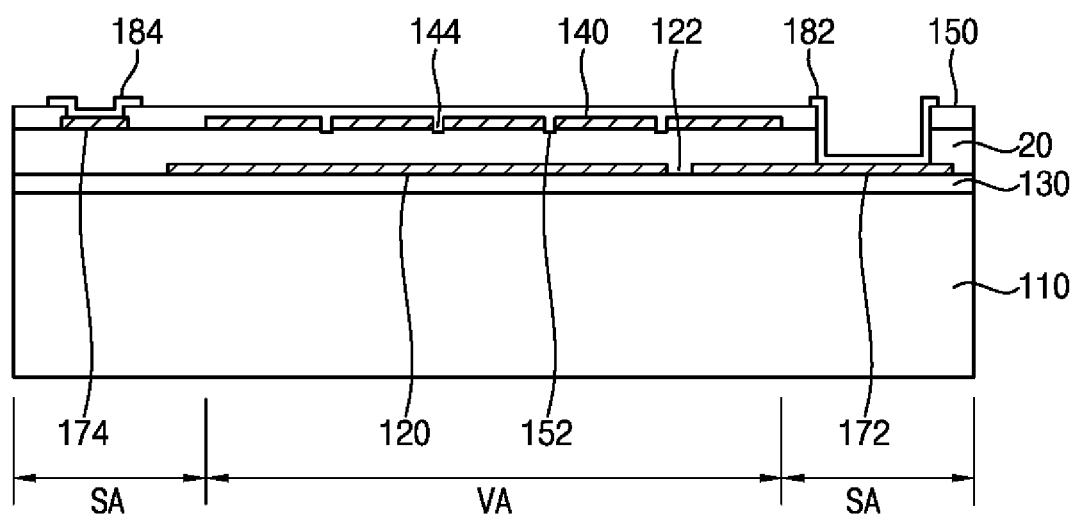

[FIG. 11]
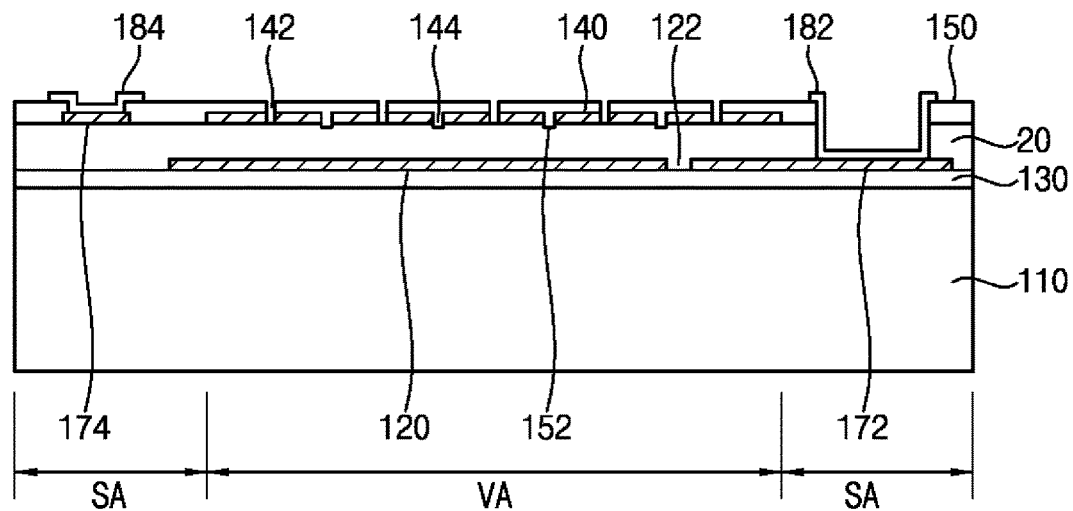
[FIG. 12]
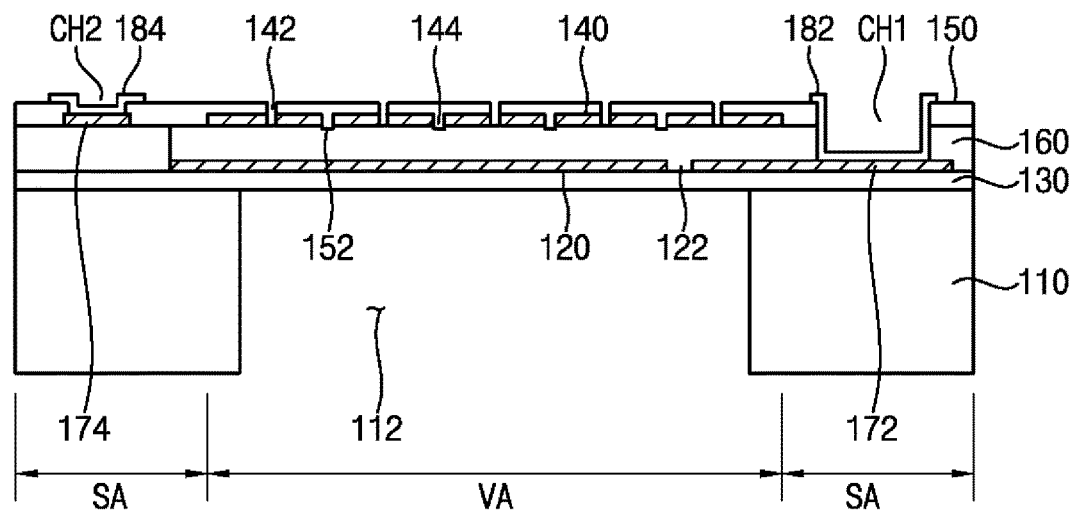

MEMS MICROPHONE AND METHOD OF MANUFACTURING THE SAME

CROSS-REFERENCE TO RELATED APPLICATION

This application claims priority to Korean Patent Application No. 10-2016-0050886, filed on Apr. 26, 2016 and all the benefits accruing therefrom under 35 U.S.C. § 119, the contents of which are incorporated by reference in their entirety.

TECHNICAL FIELD

The present disclosure relates to MEMS microphones capable of converting a sound wave into an electrical signal, and a method of manufacturing such a MEMS microphone. More particularly, embodiments described herein relate to capacitive MEMS microphones capable of detecting an acoustic pressure to create a displacement and output an acoustic signal.

BACKGROUND

Generally, a capacitive microphone utilizes a capacitance between a pair of electrodes facing each other to transmit an acoustic signal. The capacitive microphone can be manufactured by a semiconductor MEMS process to have an ultra-small size.

A MEMS microphone includes a bendable diaphragm and a back plate facing the diaphragm. The diaphragm is disposed apart from a substrate and the back plate to freely bend upward or downward in response to sound waves incident upon the diaphragm. The diaphragm can be a membrane structure to sense an acoustic pressure to create a displacement. In other words, when the acoustic pressure arrives at the diaphragm, the diaphragm may be bent toward the back plate due to the acoustic pressure. The displacement of the diaphragm can be sensed through a change of capacitance formed between the diaphragm and the back plate. As a result, sound can be converted into an electrical signal for output.

Since such a MEMS microphone is manufactured through a plurality of etching processes for patterning each of a series of layers using a corresponding mask, a manufacturing process for manufacturing the MEMS microphone is complex, requiring many masks for the manufacturing process. The MEMS microphone conventionally has an anchor for supporting the diaphragm apart from the substrate, and a chamber for forming a spacing area between the diaphragm and the back plate. The anchor and the chamber are formed through separate masks and etching processes. This increases the number of masks required for the manufacturing process of the MEMS microphone, which may cause a production cost and a processing time increase.

SUMMARY

The example embodiments of the present invention provide a MEMS microphone to achieve a simplification of a process by decreasing a number of masks required to produce a MEMS microphone.

The example embodiments of the present invention illustrate a method of manufacturing a MEMS microphone in which a decreased number of masks are required to produce a MEMS microphone.

According to an example embodiment of the present invention, a MEMS microphone includes a substrate having a cavity, a back plate disposed over the substrate and having a plurality of acoustic holes, a diaphragm disposed over the substrate to cover the cavity, the diaphragm being disposed under the back plate to be spaced apart from the back plate, including venting holes communicating with the cavity, and sensing an acoustic pressure to create a displacement. The MEMS microphone further includes a first insulation layer interposed between the substrate and the diaphragm to support the diaphragm, the first insulation layer including an opening formed at a position corresponding to the cavity to expose the diaphragm. The MEMS microphone further includes a second insulating layer formed over the substrate to cover an upper face of the back plate and an insulating interlayer formed between the first insulation layer and the second insulation layer, the insulating interlayer being located outside the vibration area and supporting the second insulation layer to space the back plate apart from the diaphragm.

In an example embodiment, the vent holes may communicate with the cavity, and the opening has an area large than that of the cavity.

In an example embodiment, the insulating interlayer may surround the diaphragm.

In an example embodiment, the back plate may include a plurality of dimple holes in a position corresponding to the cavity, and the second insulation layer includes a plurality of dimples protruding from a lower face of the back plate through the dimple holes.

In an example embodiment, the acoustic holes may penetrate through the second insulation layer and the back plate.

In an example embodiment, the MEMS microphone may further include a diaphragm pad formed on an upper surface of the first insulation layer to be electrically connected to the diaphragm, a back plate pad formed on an upper face of the insulating interlayer to be electrically connected to the back plate, a first pad electrode formed on the second insulation layer and on an upper face of the diaphragm pad to be electrically connected to the diaphragm pad and a second pad electrode formed on the second insulating layer and on an upper face of the back plate pad to be electrically connected to the back plate pad.

According to an example embodiment of the present invention, a MEMS microphone includes a substrate having a cavity, the substrate being divided into a vibration area and a peripheral area surrounding the vibration area, and a back plate disposed over the substrate and in the vibration area. The back plate has a plurality of acoustic holes and a diaphragm interposed between the substrate and the back plate to cover the cavity, the diaphragm being spaced apart from the back plate, including venting holes communicating with the cavity, and sensing an acoustic pressure to create a displacement. A first insulation layer is disposed over the substrate and under the diaphragm to support the diaphragm and to space the diaphragm apart from the substrate. The first insulation layer includes an opening in the vibration area to communicate with the cavity and to expose the diaphragm. A second insulating layer is formed over the substrate to cover an upper face of the back plate, and an insulating interlayer is interposed between the first insulation layer and the second insulation layer, and the insulating interlayer being located outside the diaphragm and supporting the second insulation layer to space the back plate from the diaphragm.

In an example embodiment, the vent holes may be formed in the vibration area and the opening may have an area larger than that of the cavity.

In an example embodiment, the insulating interlayer may surround the diaphragm.

In an example embodiment, the MEMS microphone may further include a diaphragm pad formed on an upper surface of the first insulation layer to be electrically connected to the diaphragm, a back plate pad formed on an upper face of the insulating interlayer to be electrically connected to the back plate, a first pad electrode formed on the second insulation layer and on an upper face of the diaphragm pad to be electrically connected to the diaphragm pad, and a second pad electrode formed on the second insulating layer and on an upper face of the back plate pad to be electrically connected to the back plate pad.

According to an example embodiment of the present invention of a method of manufacturing a MEMS microphone, a first silicon layer is formed on a first insulation layer formed on an upper surface of a substrate. The first silicon layer is patterned to form a diaphragm having a vent hole. Then, a sacrificial layer and a second silicon layer are sequentially formed on the first insulation layer to cover the diaphragm. After the second silicon layer is patterned to form a back plate facing the diaphragm, a second insulation layer is formed on the sacrificial layer to cover the back plate. The substrate is patterned to form a cavity to partially expose a portion of the first insulation layer positioned below the diaphragm. An exposed portion of the first insulation layer is removed through an etching process using the cavity to form an opening to expose the diaphragm. Then, a portion of the sacrificial layer located between the diaphragm and the back plate is removed through an etching process using the cavity to transform a portion of the sacrificial layer remaining outside the diaphragm into an insulating interlayer.

In an example embodiment of the present invention of a method of manufacturing a MEMS microphone, the second insulating layer and the back plate may be patterned to form a plurality of acoustic holes penetrating through the second insulating layer and the back plate, after forming the second insulation layer, wherein forming the insulating interlayer includes utilizing the cavity, the opening, the vent holes and the acoustic holes as flow paths of etchant for removing the sacrificial layer.

In an example embodiment, forming the diaphragm may include patterning the first silicon layer to form a diaphragm pad to be electrically connected to the diaphragm, and forming the back plate may include patterning the second silicon layer to form a back plate pad to be electrically connected to the back plate.

In an example embodiment of the present invention of a method of manufacturing a MEMS microphone, the second insulating layer and the sacrificial layer may be patterned to form a first pad contact hole of exposing the diaphragm pad and a second pad contact hole of exposing the back plate pad. After an electrode layer on the second insulation layer is formed to cover the first and second pad contact holes, the electrode layer may be patterned to form a first pad electrode to be electrically connected to the diaphragm pad exposed by the first contact hole, and a second pad electrode to be electrically connected to the back plate pad exposed by the second contact hole In an example embodiment forming the back plate may include patterning the second silicon layer to form a plurality of dimple holes in the back plate and partially removing a portion of the sacrificial layer exposed through the dimple holes, and forming the second insulation layer may include filling up the dimple holes to form a plurality of dimples.

In an example embodiment, the insulating interlayer may be formed to surround the diaphragm, and the dimple holes may be formed in an area corresponding to the cavity.

According to an example embodiment of the present invention of a method of manufacturing a MEMS microphone, a first silicon layer is formed on a first insulation layer formed on an upper surface of a substrate. The first silicon layer is patterned through an etching process using a diaphragm pattern mask to form a diaphragm having a vent hole in a vibration area of the substrate. A sacrificial layer and a second silicon layer are sequentially formed on the first insulation layer to cover the diaphragm. The second silicon layer is patterned through an etching process using a back plate pattern mask to form a back plate in the vibration area. A second insulating layer is formed on the sacrificial layer to cover the back plate. The substrate is patterned through an etching process using a cavity pattern mask to form a cavity for partially exposing the first insulating layer in the vibration area. an etching process is performed using the cavity an etch mask to remove a portion of the first insulation layer exposed by the cavity such that an opening is formed in the first insulation layer to expose the diaphragm, and to remove a portion of the sacrificial layer in the vibration area to transform a remaining portion of the sacrificial layer into an insulating interlayer in a peripheral area.

In an example embodiment of the present invention of a method of manufacturing a MEMS microphone, the second insulating layer and the back plate may be patterned through an etching process using an acoustic hole pattern mask to form a plurality of acoustic holes passing through the second insulating layer and the back plate in the vibration area, wherein the cavities, the openings, the vent holes, and the acoustic holes serve as flow paths of the etchant for removing the sacrificial layer.

In an example embodiment, forming the back plate may include patterning the second silicon layer to form a plurality of dimple holes in the back plate and partially removing a portion of the sacrificial layer exposed through the dimple holes, and forming the second insulation layer may include filling up the dimple holes to form a plurality of dimples.

In an example embodiment, forming the diaphragm may include patterning the first silicon layer to form a diaphragm pad to be electrically connected to the diaphragm, and forming the back plate may include includes patterning the second silicon layer to form a back plate pad to be electrically connected to the back plate, the second insulating layer and the sacrificial layer may be patterned through an etching process using a contact hole mask to form a first pad contact hole of exposing the diaphragm pad and a second pad contact hole of exposing the back plate pad. An electrode layer may be further formed on the second insulation layer to cover the first and second pad contact holes, and the electrode layer may patterned to form a first pad electrode to be electrically connected to the diaphragm pad exposed by the first contact hole, and a second pad electrode to be electrically connected to the back plate pad exposed by the second contact hole.

According to example embodiments of the present invention as described above, the first insulation layer can support the diaphragm, and the insulating interlayer can support the second insulation layer with making the back plate from to be spaced from the diaphragm such that the MEMS microphone does not need to have a chamber portion for separating an anchor and the back plate from the diaphragm.

Accordingly, masks and steps for forming the anchor and the chamber in the process for manufacturing the MEMS microphone can be omitted, so that the process can be simplified, the manufacturing cost can be reduced, and the process time can be shortened.

In addition, since the dimple holes are also formed in the process of forming the back plate, an additional process and a mask for forming the dimple holes are not required. As a result, the process time can be further shortened and the manufacturing cost can be reduced.

The above summary is not intended to describe each illustrated embodiment or every implementation of the subject matter hereof. The figures and the detailed description that follow more particularly exemplify various embodiments.

BRIEF DESCRIPTION OF THE DRAWINGS

Exemplary embodiments can be understood in more detail from the following description taken in conjunction with the accompanying drawings, in which:

FIG. 1 is a plan view illustrating a MEMS microphone in accordance with an example embodiment of the present invention;

FIG. 2 is a cross sectional view taken along a line I-I' in FIG. 1;

FIG. 3 is a flow chart illustrating a method of manufacturing a MEMS microphone in accordance with an example embodiment of the present invention; and FIGS. 4 to 12 are cross sectional views illustrating a method of manufacturing a MEMS microphone in accordance with an example embodiment of the present invention.

While various embodiments are amenable to various modifications and alternative forms, specifics thereof have been shown by way of example in the drawings and will be described in detail. It should be understood, however, that the intention is not to limit the claimed inventions to the particular embodiments described. On the contrary, the intention is to cover all modifications, equivalents, and alternatives falling within the spirit and scope of the subject matter as defined by the claims.

DETAILED DESCRIPTION OF THE DRAWINGS

Hereinafter, specific embodiments will be described in more detail with reference to the accompanying drawings. The present invention may, however, be embodied in different forms and should not be construed as limited to the embodiments set forth herein.

As an explicit definition used in this application, when a layer, a film, a region, or a plate is referred to as being 'on' another one, it can be directly on the other one, or one or more intervening layers, regions, or plates may also be present. By contrast, it will also be understood that when a layer, a region, or a plate is referred to as being 'directly on' another one, it is directly on the other one, and one or more intervening layers, regions, or plates do not exist. Also, although terms such as a first, a second, and a third are used to describe various components, compositions, regions, and layers in various embodiments of the present invention, the regions and the layers are not limited to these terms.

Furthermore, and solely for convenience of description, elements may be referred to as "above" or "below" one another. It will be understood that such description refers to the orientation shown in the Figure being described, and that in various uses and alternative embodiments these elements could be rotated or transposed in alternative arrangements and configurations.

In the following description, the technical terms are used only for explaining specific embodiments while not limiting the scope of the present invention. Unless otherwise defined herein, all the terms used herein, which include technical or scientific terms, may have the same meaning that is generally understood by those skilled in the art.

The depicted embodiments are described with reference to schematic diagrams of some embodiments of the present invention. Accordingly, changes in the shapes of the diagrams, for example, changes in manufacturing techniques and/or allowable errors, are sufficiently expected. The Figures are not necessarily drawn to scale. Accordingly, embodiments of the present invention are not described as being limited to specific shapes of areas described with diagrams and include deviations in the shapes and also the areas described with drawings are entirely schematic and their shapes do not represent accurate shapes and also do not limit the scope of the present invention.

FIG. 1 is a plan view illustrating a MEMS microphone in accordance with an example embodiment of the present invention. FIG. 2 is a cross sectional view taken along a line I-I' in FIG. 1.

Referring to FIGS. 1 and 2, a MEMS microphone in accordance with an example embodiment of the present invention is capable of creating a displacement according to an acoustic pressure to convert sound wave into an electrical signal and output the electrical signal. The MEMS microphone includes a substrate 110, a diaphragm 120, a first insulation layer 130, a back plate 140, a second insulation layer 150 and an insulating interlayer 160.

In particular, the substrate 110 is defined to be divided into a vibration area VA in which a membrane can vibrate in response to sound wave, and a peripheral area SA surrounding the vibration area VA. In the vibration area VA, a cavity 112 is formed.

The diaphragm 120 may be formed over the substrate 110 to cover the cavity 112 and to be exposed through the cavity 112. The diaphragm 120 may be formed to have a membrane structure. An end portion of the diaphragm 120 may be positioned in the peripheral area SA. The diaphragm 120 may sense an acoustic pressure to create a displacement, and is apart from the substrate 110 in order to be bendable upwardly or downwardly in response to the acoustic pressure. The diaphragm 120 may have an ion implantation region into which impurities are doped.

In an example embodiment, the diaphragm may have a shape of a disc plate, and the cavity may have a cylindrical shape, a shown in FIG. 1.

The first insulation layer 130 is disposed over the substrate 110 and under the diaphragm 120. The first insulation layer 130 may support the diaphragm 120 while separating the diaphragm 120 from the substrate 110. That is, the first insulation layer 130 may support an end portion of the diaphragm 120 to make the diaphragm 120 to be spaced apart from the substrate 110 such that the diaphragm 120 is separated both electrically and mechanically from the substrate 110 and the diaphragm 120 covers the cavity 112.

Particularly, the first insulation layer 130 has an opening 132 by removing a portion of the first insulation layer, corresponding to the cavity to partially expose the diaphragm 120 through the cavity 112. The diaphragm 120 is exposed through the opening 132 and the cavity 112, and thus can be bent downward by the acoustic pressure which is applied to the diaphragm 120.

In an embodiment of the present invention, the opening 132 may an area larger than that of the cavity 112 and identical to the vibration area VA. The first insulation layer 130 may support the end portion of the diaphragm 120 in the peripheral area SA.

As described above, the MEMS microphone 100 according to embodiments of the present invention is configured such that the first insulation layer 130 supports the diaphragm 120 to separate the diaphragm 120 from the substrate 110 without forming a separate anchor. Accordingly, the structure and manufacturing process of the MEMS microphone 100 can be simplified, and process times and manufacturing costs of the MEMS microphone 100 can be reduced.

Meanwhile, the back plate 140 may be disposed over the diaphragm 120. The back plate 140 may be disposed in the vibration area VA and may be disposed to face the diaphragm 120. As shown in FIG. 1, the back plate 140 may be formed in a circular shape. Further, the back plate 140 may be spaced apart from the diaphragm 120 to form an air gap AG between the back plate 140 and the diaphragm 120. Like the diaphragm 120, impurity doping process may be performed through an ion implantation process to form the back plate 140.

As shown in FIG. 2, the back plate 140 is spaced apart from the diaphragm 120 such that the diaphragm 120 can be bent upward by the acoustic pressure. The air gap AG may be formed by removing a sacrificial layer positioned between the diaphragm 120 and the back plate 140 such that the diaphragm 120 is spaced apart from the back plate 140.

In an example embodiment, the diaphragm 120 may have a plurality of vent holes 122 through which the air gap AG is communicated with the opening portion 132 of the first insulation layer 130. The vent holes 122 penetrate through the diaphragm 120 to serve as a path of sound wave and a flow path through which an etchant flows for removing a sacrificial layer between the diaphragm 120 and the back plate 140 using the etchant. Further, the vent holes 122 may be formed in a region corresponding to the cavity 112 to communicate with the cavity 112.

The second insulation layer 150 may be disposed over the substrate 110 over which the back plate 140 is formed. The second insulation layer 140 may cover an upper face of the back plate 140.

The back plate 140 and the second insulation layer 150 may include a plurality of acoustic holes 142 through which sound waves pass. The acoustic holes 142 are formed through the back plate 140 and the second insulation layer 150. Thus, the acoustic holes may communicate with the air gap AG.

The back plate 140 may have a plurality of dimple holes 144 and the second insulation layer 150 may have a plurality of dimples 152 corresponding to the dimple holes 144. The dimple holes 144 are formed through the back plate 140, and the dimples 152 are provided at a position where the dimple holes 144 are formed.

The dimples 152 may prevent the diaphragm 120 from adhering to the bottom surface of the back plate 140. That is, when sound reaches to the diaphragm 120, the diaphragm 120 may be bent in a semicircular shape toward the back plate 140, and then return to its initial position. The degree of bending of the diaphragm 120 may vary depending on the strength of the sound. The upper face of the diaphragm 120 may be bent to contact the lower surface of the back plate 140. When the diaphragm 120 is bent so much as to make contact with the back plate 140, the diaphragm 120 may not return from the back plate 140 to the initial position.

However, in case that the dimples 152 protrude from the lower face of the back plate 140 toward the diaphragm 120, the dimples 152 may make the diaphragm 120 to be spaced apart from and the back plate 140 such that the diaphragm 120 can return to the initial position, even though the diaphragm 120 is so much bent as to make the diaphragm 120 to contact the back plate 140.

The back plate 140 may be spaced apart from the diaphragm 120. The insulation interlayer 160 may be interposed between the back plate 140 and the diaphragm 120 and may be positioned in the peripheral area SA. The insulating interlayer 160 may support the second insulation layer 150 to make the back plate 140 which is connected to a lower face to the second insulation layer 150 to be spaced apart from the diaphragm 120. Since the insulating interlayer 160 instead of a chamber supports the second insulation 150, it may be unnecessary to form the chamber for making the back plate 140 to be apart from the diaphragm 120. Thus, the structure and manufacturing process of the MEMS microphone 100 can be simplified, and process times and manufacturing costs of the MEMS microphone 100 can be reduced.

Even though shown in detail in figures, a side portion of the air gap AG may be defined by the insulating interlayer 160. Thus, the air gap AG may be formed in a region surrounded by the insulating interlayer 160.

The diaphragm 120 may be connected to the diaphragm pad 172, and the back plate 140 may be connected to the back plate pad 174. The diaphragm pad 172 and the back plate pad 174 may be located in the peripheral area SA. The diaphragm pad 172 is provided on the upper surface of the second insulation layer 150 and is exposed through a first contact hole CH1 formed by partially removing both the second insulating layer 150 and insulating interlayer 160. The back plate pad 174 may be formed on the upper surface of the insulating interlayer 160 and may be exposed through a second contact hole CH2 formed by partially removing the second insulation layer 150.

The first and second pad electrodes 182 and 184 may be formed on the second insulation layer 150. The first pad electrode 182 is located on the upper side of the diaphragm pad 172 and makes contact with the diaphragm pad 172 through the first contact hole CH1. Thus, the first pad electrode 182 is electrically connected to the diaphragm pad 172. On the other hands, the second pad electrode 184 is positioned on the back plate pad 174 and makes contact with the back plate pad 174 through the second contact hole CH2. Thus, the second pad electrode 184 is electrically connected to the back plate pad 174. Here, the first and second pad electrodes 182 and 184 may be transparent electrodes.

Hereinafter, the method of manufacturing the MEMS microphone will be described in detail with reference to the drawings.

FIG. 3 is a flow chart illustrating a method of manufacturing a MEMS microphone in accordance with an example embodiment of the present invention. FIGS. 4 to 12 are cross sectional views illustrating a method of manufacturing a MEMS microphone in accordance with an example embodiment of the present invention.

Referring to FIGS. 3 to 5, according to a method for manufacturing the MEMS microphone 101 in accordance with an example embodiment, a first silicon layer 12 is deposited on an upper face of a first insulation layer 130 formed on a substrate 110, as shown in FIG. 4 (step S105). Here, the first silicon layer 12 may be made of polysilicon.

Next, the first silicon layer 12 is patterned through an etching process using a diaphragm pattern mask to form a diaphragm 120 as shown in FIG. 5 (step S110). A plurality of vent holes 122 may be formed in the diaphragm 120 through the etching process using the diaphragm pattern mask. A diaphragm pad 172 electrically connected to the diaphragm 120 may be formed on the substrate 110 in a peripheral area SA of the substrate 110.

In an embodiment of the present invention, the method of manufacturing a MEMS microphone may further include a step of performing an ion implantation process against the first silicon layer 12, prior to performing the etching process using the diaphragm pattern mask. Particularly, since the MEMS microphone 100 does not have a separate anchor being connected with an end portion of the diaphragm 120, for supporting the diaphragm 120 which is to be spaced apart from the substrate 110, a separate mask for performing the ion implantation process may not be required. The ion implantation of the diaphragm 120 is possible without using it. Accordingly, the method of manufacturing a MEMS microphone according to an embodiment of the present invention can reduce the number of masks, thereby reducing manufacturing costs.

FIGS. 3, 6 and 7, a sacrificial layer 20 and a second silicon layer 14 are formed in order on the first insulation layer 130 to cover the diaphragm 120 and the diaphragm pad 172 (Step S115). Here, the second silicon layer 14 may be made of polysilicon, and the sacrificial layer 20 may be made of silicon oxide, although in alternative embodiments other materials could be used that are differentially etchable with respect to one another.

Next, the second silicon layer 14 is patterned through an etching process using a back plate pattern mask to form the back plate 140, as shown in FIG. 7 (step S120). Dimple holes 144 may be also formed through the back plate 140 by performing the etching process using the back plate pattern mask, and the back plate pad 174 to be electrically connected to the back plate 140 may be formed on the sacrificial layer 20 in the peripheral region SA. At this time, portions of the sacrificial layer 20, corresponding to the dimple holes 144 may be partially etched so that the dimples 154 (see FIG. 2) protrude from a lower face of the back plate 140.

Referring to FIGS. 3, 8 and 9, a second insulation layer 150 is formed on the sacrificial layer 20 to cover the back plate 140 (step S125). At this time, the dimples 152 may be formed through the dimple holes 144.

Then, the second insulating layer 150 and the sacrificial layer 20 are patterned through an etching process using a contact hole pattern mask to form a first contact hole CH1 to expose the diaphragm pad 172, and a second contact hole CH2 to expose the back plate pad 174 (step S130).

Next, an electrode layer (not shown) is formed on the second insulation layer 150 to partially fill up the first and second contact holes CH1 and CH2 (step S135).

Referring to FIGS. 3 and 10, the electrode layer is patterned through an etching process using an electrode pattern mask to form first and second pad electrodes 182 and 184 (step S140).

Referring to FIGS. 3 and 11, the second insulating layer 150 and the back plate 140 are patterned through an etching process using an acoustic hole pattern mask to form acoustic holes 142 (step S145).

Next, referring to FIGS. 3 and 12, the substrate 110 is patterned through an etching process using a cavity pattern mask to form a cavity 112 in a vibration area VA (step S150).

Referring to FIGS. 2, 3, and 12, a portion of the first insulation layer 130 exposed through the cavity 112 is removed through an etching process using the cavity 112 to form an opening portion 132 to expose the diaphragm 120 (step S155). At this time, the substrate 110 may be used as an etching mask for patterning the first insulating layer 130, and the opening 132 may be formed to be larger than the cavity 112. Here, HF vapor may be used as an etchant for forming the opening 132.

Since the end portion of the diaphragm 120 is supported by the first insulation layer 130, the MEMS microphone 100 need not have a separate anchor for supporting the diaphragm 120 from the substrate 110. Accordingly, since the masks for patterning the first insulation layer 130 and for forming the anchor may not be required, manufacturing costs can be reduced and process times can be shortened compared to conventional MEMS microphones.

Subsequently, the etchant is supplied through the cavity 112 of the substrate 110 and the vent holes 122 to remove a portion of the sacrificial layer 20 located on the upper surface of the diaphragm 120, thereby forming the air gap AG (step 160). Thus, the MEMS microphone 100 is completed. At this time, the etchant may be also supplied to the sacrificial layer through the acoustic holes 142 which may serve as a flow path of the etching fluid.

The sacrificial layer 20 remains in the peripheral region SA to form an insulating interlayer 160. The insulating interlayer 160 supports the second insulating layer 150, and defines an air gap AG together with the lower face of the back plate 140 and the upper face of the diaphragm 120. At this time, an etching area of the sacrificial layer 20 removed by the etchant can be controlled by the process time, that is, the etching process against the sacrificial layer 20 may be controlled depending on a predetermined size of the air gap AG.

In an embodiment of the present invention, steps S155 and S160 may be simultaneously performed, where the etchant is provided toward the substrate 110 downwardly and upwardly.

As described above, according to example embodiment of a MEMS microphone manufacturing method, the etching area of the sacrificial layer removed by the etchant can be controlled by the process time. Thus, the insulating interlayer 160 may make the back plate 140 to be spaced apart from the diaphragm 120 without forming a chamber portion. Accordingly, masks for patterning the sacrificial layer 20 and the first insulating layer 120 in order to form the chamber portion, and step for forming the chamber portion are not required. As a result, manufacturing costs and times of manufacturing the MEMS microphone can be reduced.

The first insulation layer 130 may support the end portion of the diaphragm 120 which is different from the prior art a separate additional member for supporting the diaphragm 120 such as an anchor such that a process of forming the anchor for supporting the diaphragm 120 can be omitted. Thus, the process can be simplified and the process time can be shortened. In addition, since the mask for forming the anchor and the mask for performing an ion implantation process against the diaphragm 120 may not be required. Thus, the manufacturing costs and times of manufacturing the MEMS microphone can be reduced.

Further, since the dimple holes 144 are also formed in the process of forming the back plate 140 using the back plate pattern mask, a separate additional process for forming the dimple holes 144 can be omitted.

Furthermore, while the step S125 of forming the contact hole 162 before the step S135 of forming the first and second contact holes CH1 and CH2, the first contact hole CH1 is formed The first and second contact holes CH1 and CH2 can be formed together by removing the sacrificial layer to be formed.

Thus, according to example embodiments of an method of the present invention totally six masks can be utilized to manufacture the MEMS microphone 100 to reduce the number of mask required, compared to the prior art, thereby simplifying the process, shortening the process times and saving the manufacturing costs.

Although the semiconductor gas sensors have been described with reference to the specific embodiments, they are not limited thereto. Therefore, it will be readily understood by those skilled in the art that various modifications and changes can be made thereto without departing from the spirit and scope of the appended claims.

Various embodiments of systems, devices, and methods have been described herein. These embodiments are given only by way of example and are not intended to limit the scope of the claimed inventions. It should be appreciated, moreover, that the various features of the embodiments that have been described may be combined in various ways to produce numerous additional embodiments. Moreover, while various materials, dimensions, shapes, configurations and locations, etc. have been described for use with disclosed embodiments, others besides those disclosed may be utilized without exceeding the scope of the claimed inventions.

Persons of ordinary skill in the relevant arts will recognize that the subject matter hereof may comprise fewer features than illustrated in any individual embodiment described above. The embodiments described herein are not meant to be an exhaustive presentation of the ways in which the various features of the subject matter hereof may be combined. Accordingly, the embodiments are not mutually exclusive combinations of features; rather, the various embodiments can comprise a combination of different individual features selected from different individual embodiments, as understood by persons of ordinary skill in the art. Moreover, elements described with respect to one embodiment can be implemented in other embodiments even when not described in such embodiments unless otherwise noted.

Although a dependent claim may refer in the claims to a specific combination with one or more other claims, other embodiments can also include a combination of the dependent claim with the subject matter of each other dependent claim or a combination of one or more features with other dependent or independent claims. Such combinations are proposed herein unless it is stated that a specific combination is not intended.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims, it is expressly intended that the provisions of 35 U.S.C. § 112(f) are not to be invoked unless the specific terms "means for" or "step for" are recited in a claim.

The invention claimed is:

1. A MEMS microphone comprising:
a substrate having a cavity;
a back plate disposed over the substrate and defining a plurality of acoustic holes;
a diaphragm disposed over the substrate to cover the cavity at a vibration area, the diaphragm being disposed under the back plate and spaced apart from the back plate, the diaphragm defining venting holes communicating with the cavity and configured to sense an acoustic pressure to create a displacement;
a first insulation layer interposed between the substrate and the diaphragm to support the diaphragm, and the first insulation layer including an opening formed at a position corresponding to the cavity to expose the diaphragm;
a second insulating layer formed over the substrate to cover an upper face of the back plate;
an insulating interlayer formed between the first insulation layer and the second insulation layer, and the insulation interlayer being located outside the vibration area and supporting the second insulation layer to space the back plate from the diaphragm;
a diaphragm pad formed on an upper surface of the first insulation layer to be electrically connected to the diaphragm; and
a back plate pad formed on an upper face of the insulating interlayer to be electrically connected to the back plate,
wherein the first insulation layer makes direct contact with a lower face of the diaphragm to support the diaphragm.

2. The MEMS microphone of claim 1, wherein the vent holes communicate with the cavity, and the opening has an area larger than a width of the cavity.

3. The MEMS microphone of claim 1, wherein the insulating interlayer surrounds the diaphragm on at least one side.

4. The MEMS microphone of claim 1, wherein the back plate includes a plurality of dimple holes in a position corresponding to the cavity, and the second insulation layer includes a plurality of dimples protruding from a lower face of the back plate through the dimple holes.

5. The MEMS microphone of claim 1, wherein the acoustic holes penetrate through the second insulation layer and the back plate.

6. The MEMS microphone of claim 1, further comprising:
a first pad electrode formed on the second insulation layer and on an upper face of the diaphragm pad to be electrically connected to the diaphragm pad; and
a second pad electrode formed on the second insulating layer and on an upper face of the back plate pad to be electrically connected to the back plate pad.

7. A MEMS microphone comprising:
a substrate defining a cavity, the substrate being divided into a vibration area and a peripheral area surrounding the vibration area;
a back plate disposed over the substrate and in the vibration area, and the back plate defining a plurality of acoustic holes;
a diaphragm interposed between the substrate and the back plate to cover the cavity, the diaphragm being spaced apart from the back plate, including venting holes communicating with the cavity, and sensing an acoustic pressure to create a displacement;
a first insulation layer disposed between the substrate and the diaphragm to support the diaphragm and to space the diaphragm apart from the substrate, and the first insulation layer including an opening in the vibration area to communicate with the cavity and to expose the diaphragm;
a second insulating layer formed over the substrate to cover an upper face of the back plate;
an insulating interlayer interposed between the first insulation layer and the second insulation layer, and the insulation interlayer being located outside the diaphragm and supporting the second insulation layer to space the back plate apart from the diaphragm;

a diaphragm pad formed on an upper surface of the first insulation layer to be electrically connected to the diaphragm; and a back plate pad formed on an upper face of the insulating interlayer to be electrically connected to the back plate, wherein the first insulation layer makes direct contact with a lower face of the diaphragm to support the diaphragm.

8. The MEMS microphone of claim 7, wherein the vent holes are formed in the vibration area and the opening has an area larger than that of the cavity.

9. The MEMS microphone of claim 7, wherein the insulating interlayer surrounds the diaphragm.

10. The MEMS microphone of claim 7, further comprising:
a first pad electrode formed on the second insulation layer and on an upper face of the diaphragm pad to be electrically connected to the diaphragm pad; and
a second pad electrode formed on the second insulating layer and on an upper face of the back plate pad to be electrically connected to the back plate pad.

11. A method of manufacturing a MEMS microphone comprising:
forming a first silicon layer on a first insulation layer formed on an upper surface of a substrate;
patterning the first silicon layer to form a diaphragm having a vent hole;
sequentially forming a sacrificial layer and a second silicon layer on the first insulation layer to cover the diaphragm;
patterning the second silicon layer to form a back plate facing the diaphragm;
forming a second insulation layer on the sacrificial layer to cover the back plate;
patterning the substrate to form a cavity to partially expose a portion of the first insulation layer positioned beneath the diaphragm;
removing an exposed portion of the first insulation layer through an etching process using the cavity to form an opening to expose the diaphragm; and
removing a portion of the sacrificial layer located between the diaphragm and the back plate through an etching process using the cavity to transform a portion of the sacrificial layer remaining outside the diaphragm into an insulating interlayer,
wherein the first insulation layer makes direct contact with a lower face of the diaphragm to support the diaphragm, and
forming the diaphragm includes patterning the first silicon layer to form a diaphragm pad to be electrically connected to the diaphragm, and forming the back plate includes patterning the second silicon layer to form a back plate pad to be electrically connected to the back plate.

12. The method of claim 11, further comprising:
patterning the second insulating layer and the back plate to form a plurality of acoustic holes penetrating through the second insulating layer and the back plate;
wherein forming the insulating interlayer includes utilizing the cavity, the opening, the vent holes and the acoustic holes as flow paths of an etchant for removing the sacrificial layer.

13. The method of claim 11, further comprising:
patterning the second insulating layer and the sacrificial layer to form a first pad contact hole of exposing the diaphragm pad and a second pad contact hole of exposing the back plate pad;
forming an electrode layer on the second insulation layer to cover the first and second pad contact holes; and
patterning the electrode layer to form a first pad electrode to be electrically connected to the diaphragm pad exposed by the first contact hole, and a second pad electrode to be electrically connected to the back plate pad exposed by the second contact hole.

14. The method of claim 11, wherein forming the back plate includes patterning the second silicon layer to form a plurality of dimple holes in the back plate and partially removing a portion of the sacrificial layer exposed through the dimple holes, and forming the second insulation layer includes filling up the dimple holes to form a plurality of dimples.

15. The method of claim 14, wherein the insulating interlayer is formed to surround the diaphragm, and the dimple holes are formed in an area corresponding to the cavity.

16. The method of claim 11, wherein:
patterning the first silicon layer comprises an etching process using a diaphragm pattern mask to form a diaphragm having a vent hole in a vibration area of the substrate;
patterning the second silicon layer comprises an etching process using a back plate pattern mask to form a back plate in the vibration area;
patterning the substrate comprises an etching process using a cavity pattern mask to form a cavity for partially exposing the first insulating layer in the vibration area; and
removing the exposed portion of the first insulation layer and the portion of the sacrificial layer comprises:
performing an etching process using the cavity an etch mask to remove a portion of the first insulation layer exposed by the cavity such that an opening is formed in the first insulation layer to expose the diaphragm, and
performing an etching process to remove the portion of the sacrificial layer in the vibration area to transform a remaining portion of the sacrificial layer into an insulating interlayer in a peripheral area.

17. The method of claim 16, further comprising:
patterning the second insulating layer and the back plate through an etching process using an acoustic hole pattern mask to form a plurality of acoustic holes passing through the second insulating layer and the back plate in the vibration area;
wherein the cavities, the openings, the vent holes, and the acoustic holes serve as flow paths of the etchant for removing the sacrificial layer.

18. The method of claim 16, wherein forming the back plate includes patterning the second silicon layer to form a plurality of dimple holes in the back plate and partially removing a portion of the sacrificial layer exposed through the dimple holes, and forming the second insulation layer includes filling up the dimple holes to form a plurality of dimples.

19. The method of claim 16, wherein forming the diaphragm includes patterning the first silicon layer to form a diaphragm pad to be electrically connected to the diaphragm, and forming the back plate includes patterning the second silicon layer to form a back plate pad to be electrically connected to the back plate, further comprising:
patterning the second insulating layer and the sacrificial layer through an etching process using a contact hole mask to form a first pad contact hole of exposing the diaphragm pad and a second pad contact hole of exposing the back plate pad;

forming an electrode layer on the second insulation layer to cover the first and second pad contact holes; and patterning the electrode layer to form a first pad electrode to be electrically connected to the diaphragm pad exposed by the first contact hole, and a second pad electrode to be electrically connected to the back plate pad exposed by the second contact hole.

* * * * *